United States Patent
Filippini et al.

(10) Patent No.: US 11,722,141 B1
(45) Date of Patent: Aug. 8, 2023

(54) DELAY-LOCKED-LOOP TIMING ERROR MITIGATION

(71) Applicant: Allegro MicroSystems, LLC, Manchester, NH (US)

(72) Inventors: Leo Filippini, Portland, OR (US); Charles Myers, Portland, OR (US); Adam Lee, Portland, OR (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/660,221

(22) Filed: Apr. 22, 2022

(51) Int. Cl.
*H03L 7/095* (2006.01)
*H03L 7/081* (2006.01)

(52) U.S. Cl.
CPC ............ *H03L 7/095* (2013.01); *H03L 7/0812* (2013.01)

(58) Field of Classification Search
CPC ............................. H03L 7/095; H03L 7/0812
See application file for complete search history.

(56) References Cited

U.S. PATENT DOCUMENTS

| | | | |
|---|---|---|---|
| 5,917,320 A | 6/1999 | Scheller et al. | |
| 6,091,239 A | 7/2000 | Vig et al. | |
| 6,297,627 B1 | 10/2001 | Towne et al. | |
| 6,693,419 B2 | 2/2004 | Stauth et al. | |
| 6,760,145 B1 | 7/2004 | Taylor et al. | |
| 6,778,728 B2 | 8/2004 | Taylor et al. | |
| 6,894,823 B2 | 5/2005 | Taylor et al. | |
| 6,989,921 B2 | 1/2006 | Bernstein et al. | |
| 7,015,780 B2 | 3/2006 | Bernstein et al. | |
| 7,160,753 B2 | 1/2007 | Williams, Jr. | |
| 7,253,614 B2 | 8/2007 | Forrest et al. | |
| 7,321,649 B2 * | 1/2008 | Lee | H03L 7/095 375/376 |
| 7,432,537 B1 | 10/2008 | Huntington | |
| 7,504,053 B1 | 3/2009 | Alekel | |
| 7,605,623 B2 * | 10/2009 | Yun | H03L 7/087 327/158 |

(Continued)

FOREIGN PATENT DOCUMENTS

TW 201422772 6/2014

OTHER PUBLICATIONS

U.S. Appl. No. 17/645,118, filed Dec. 20, 2021, Babushkin, et al.

(Continued)

*Primary Examiner* — Adam D Houston
(74) *Attorney, Agent, or Firm* — Daly, Crowley, Mofford & Durkee, LLP

(57) ABSTRACT

Systems, methods, and circuits provide delay-locked loop (DLL) timing error mitigation. A DLL false-lock detection system can include DLL circuitry configured to receive a reference clock signal having a time period. The system can include shift register circuitry and latched comparison circuitry which can determine a time period of a locked condition of the DLL delay line with respect to the reference clock signal time period. The system can determine whether the system is correctly locked to the base time period or incorrectly locked to a multiple of the base time period. A further system can operate to cause a phase detector circuitry in a DLL to ignore the first edge of a reference clock signal presented to the phase detector circuitry and thereby avoid stuck-lock conditions.

29 Claims, 6 Drawing Sheets

(56) References Cited

U.S. PATENT DOCUMENTS

| | | | |
|---|---|---|---|
| 7,724,050 B2 * | 5/2010 | Lee | H03L 7/0816 |
| | | | 327/158 |
| 7,764,719 B2 | 7/2010 | Munroe et al. | |
| 7,782,911 B2 | 8/2010 | Munroe et al. | |
| 7,787,262 B2 | 8/2010 | Mangtani et al. | |
| 7,852,549 B2 | 12/2010 | Alekel et al. | |
| 7,885,298 B2 | 2/2011 | Munroe | |
| 7,990,194 B2 * | 8/2011 | Shim | G11C 7/222 |
| | | | 327/158 |
| 7,994,421 B2 | 8/2011 | Williams et al. | |
| 8,207,484 B1 | 6/2012 | Williams | |
| 8,319,307 B1 | 11/2012 | Williams | |
| 8,570,372 B2 | 10/2013 | Russell | |
| 8,597,544 B2 | 12/2013 | Alekel | |
| 8,630,036 B2 | 1/2014 | Munroe | |
| 8,630,320 B2 | 1/2014 | Munroe et al. | |
| 8,729,890 B2 | 5/2014 | Donovan et al. | |
| 8,730,564 B2 | 5/2014 | Alekel | |
| 8,743,453 B2 | 6/2014 | Alekel et al. | |
| 8,760,499 B2 | 6/2014 | Russell | |
| 8,766,682 B2 | 7/2014 | Williams | |
| 8,853,639 B2 | 10/2014 | Williams, Jr. | |
| 8,917,128 B1 * | 12/2014 | Baek | G11C 7/222 |
| | | | 327/158 |
| 9,121,762 B2 | 9/2015 | Williams et al. | |
| 9,164,826 B2 | 10/2015 | Fernandez | |
| 9,197,233 B2 | 11/2015 | Gaalema et al. | |
| 9,269,845 B2 | 2/2016 | Williams et al. | |
| 9,329,057 B2 | 5/2016 | Foletto et al. | |
| 9,368,933 B1 | 6/2016 | Nijjar et al. | |
| 9,397,469 B1 | 7/2016 | Nijjar et al. | |
| 9,447,299 B2 | 9/2016 | Schut et al. | |
| 9,451,554 B1 | 9/2016 | Singh et al. | |
| 9,466,745 B2 | 10/2016 | Williams et al. | |
| 9,520,871 B2 | 12/2016 | Eagen et al. | |
| 9,553,216 B2 | 1/2017 | Williams et al. | |
| 9,591,238 B2 | 3/2017 | Lee et al. | |
| 9,621,041 B2 | 4/2017 | Sun et al. | |
| 9,693,035 B2 | 6/2017 | Williams et al. | |
| 9,759,602 B2 | 9/2017 | Williams | |
| 9,804,264 B2 | 10/2017 | Villeneuve et al. | |
| 9,810,775 B1 | 11/2017 | Welford et al. | |
| 9,810,777 B2 | 11/2017 | Williams et al. | |
| 9,810,786 B1 | 11/2017 | Welford et al. | |
| 9,812,838 B2 | 11/2017 | Villeneuve et al. | |
| 9,823,353 B2 | 11/2017 | Eichenholz et al. | |
| 9,835,490 B2 | 12/2017 | Williams et al. | |
| 9,841,495 B2 | 12/2017 | Campbell et al. | |
| 9,843,157 B2 | 12/2017 | Williams | |
| 9,847,441 B2 | 12/2017 | Huntington | |
| 9,857,468 B1 | 1/2018 | Eichenholz et al. | |
| 9,869,754 B1 | 1/2018 | Campbell et al. | |
| 9,874,635 B1 | 1/2018 | Eichenholz et al. | |
| 9,897,687 B1 | 2/2018 | Campbell et al. | |
| 9,905,992 B1 | 2/2018 | Welford et al. | |
| 9,910,088 B2 | 3/2018 | Milano et al. | |
| 9,923,331 B2 | 3/2018 | Williams | |
| 9,941,433 B2 | 4/2018 | Williams et al. | |
| 9,958,545 B2 | 5/2018 | Eichenholz et al. | |
| 9,989,629 B1 | 6/2018 | LaChapelle | |
| 9,995,622 B2 | 6/2018 | Williams | |
| 10,003,168 B1 | 6/2018 | Villeneuve | |
| 10,007,001 B1 | 6/2018 | LaChapelle et al. | |
| 10,012,732 B2 | 7/2018 | Eichenholz et al. | |
| 10,056,909 B1 * | 8/2018 | Qi | H03L 7/0818 |
| 10,061,019 B1 | 8/2018 | Campbell et al. | |
| 10,073,136 B2 | 9/2018 | Milano et al. | |
| 10,088,559 B1 | 10/2018 | Weed et al. | |
| 10,094,925 B1 | 10/2018 | LaChapelle | |
| 10,110,128 B2 | 10/2018 | Raval et al. | |
| 10,114,111 B2 | 10/2018 | Russell et al. | |
| 10,121,813 B2 | 11/2018 | Eichenholz et al. | |
| 10,139,478 B2 | 11/2018 | Gaalema et al. | |
| 10,156,461 B2 | 12/2018 | Snyder et al. | |
| 10,169,678 B1 | 1/2019 | Sachdeva et al. | |
| 10,169,680 B1 | 1/2019 | Sachdeva et al. | |
| 10,175,345 B2 | 1/2019 | Rhee et al. | |
| 10,175,697 B1 | 1/2019 | Sachdeva et al. | |
| 10,191,155 B2 | 1/2019 | Curatu | |
| 10,209,359 B2 | 2/2019 | Russell et al. | |
| 10,211,592 B1 | 2/2019 | Villeneuve et al. | |
| 10,211,593 B1 | 2/2019 | Lingvay et al. | |
| 10,217,889 B2 | 2/2019 | Dhulla et al. | |
| 10,218,144 B2 | 2/2019 | Munroe et al. | |
| 10,241,198 B2 | 3/2019 | LaChapelle et al. | |
| 10,254,388 B2 | 4/2019 | LaChapelle et al. | |
| 10,254,762 B2 | 4/2019 | McWhirter et al. | |
| 10,267,898 B2 | 4/2019 | Campbell et al. | |
| 10,267,899 B2 | 4/2019 | Weed et al. | |
| 10,267,918 B2 | 4/2019 | LaChapelle et al. | |
| 10,275,689 B1 | 4/2019 | Sachdeva et al. | |
| 10,291,125 B2 | 5/2019 | Raval et al. | |
| 10,295,668 B2 | 5/2019 | LaChapelle et al. | |
| 10,310,058 B1 | 6/2019 | Campbell et al. | |
| 10,324,170 B1 | 6/2019 | Engberg, Jr. et al. | |
| 10,324,185 B2 | 6/2019 | McWhirter et al. | |
| 10,338,199 B1 | 7/2019 | McWhirter et al. | |
| 10,338,223 B1 | 7/2019 | Englard et al. | |
| 10,340,651 B1 | 7/2019 | Drummer et al. | |
| 10,345,437 B1 | 7/2019 | Russell et al. | |
| 10,345,447 B1 | 7/2019 | Hicks | |
| 10,348,051 B1 | 7/2019 | Shah et al. | |
| 10,386,489 B2 | 8/2019 | Albelo et al. | |
| 10,394,243 B1 | 8/2019 | Ramezani et al. | |
| 10,401,480 B1 | 9/2019 | Gaalema et al. | |
| 10,401,481 B2 | 9/2019 | Campbell et al. | |
| 10,418,776 B2 | 9/2019 | Welford et al. | |
| 10,445,599 B1 | 10/2019 | Hicks | |
| 10,451,716 B2 | 10/2019 | Hughes et al. | |
| 10,473,788 B2 | 11/2019 | Englard et al. | |
| 10,481,181 B2 | 11/2019 | Bussing et al. | |
| 10,481,605 B1 | 11/2019 | Maila et al. | |
| 10,488,458 B2 | 11/2019 | Milano et al. | |
| 10,488,496 B2 | 11/2019 | Campbell et al. | |
| 10,491,885 B1 | 11/2019 | Hicks | |
| 10,498,384 B2 | 12/2019 | Briano | |
| 10,502,831 B2 | 12/2019 | Eichenholz | |
| 10,503,172 B2 | 12/2019 | Englard et al. | |
| 10,509,127 B2 | 12/2019 | Englard et al. | |
| 10,514,462 B2 | 12/2019 | Englard et al. | |
| 10,520,602 B2 | 12/2019 | Villeneuve et al. | |
| 10,523,884 B2 | 12/2019 | Lee et al. | |
| 10,535,191 B2 | 1/2020 | Sachdeva et al. | |
| 10,539,665 B1 | 1/2020 | Danziger et al. | |
| 10,545,240 B2 | 1/2020 | Campbell et al. | |
| 10,551,485 B1 | 2/2020 | Maheshwari et al. | |
| 10,551,501 B1 | 2/2020 | LaChapelle | |
| 10,557,939 B2 | 2/2020 | Campbell et al. | |
| 10,557,940 B2 | 2/2020 | Eichenholz et al. | |
| 10,571,567 B2 | 2/2020 | Campbell et al. | |
| 10,571,570 B1 | 2/2020 | Paulsen et al. | |
| 10,578,720 B2 | 3/2020 | Hughes et al. | |
| 10,591,600 B2 | 3/2020 | Villeneuve et al. | |
| 10,591,601 B2 | 3/2020 | Hicks et al. | |
| 10,606,270 B2 | 3/2020 | Englard et al. | |
| 10,613,158 B2 | 4/2020 | Cook et al. | |
| 10,627,495 B2 | 4/2020 | Gaalema et al. | |
| 10,627,512 B1 | 4/2020 | Hicks | |
| 10,627,516 B2 | 4/2020 | Eichenholz | |
| 10,627,521 B2 | 4/2020 | Englard et al. | |
| 10,634,735 B2 | 4/2020 | Kravljaca et al. | |
| 10,636,285 B2 | 4/2020 | Haas et al. | |
| 10,641,874 B2 | 5/2020 | Campbell et al. | |
| 10,663,564 B2 | 5/2020 | LaChapelle | |
| 10,663,585 B2 | 5/2020 | McWhirter | |
| 10,677,897 B2 | 6/2020 | LaChapelle et al. | |
| 10,677,900 B2 | 6/2020 | Russell et al. | |
| 10,684,360 B2 | 6/2020 | Campbell | |
| 10,908,190 B2 | 2/2021 | Bussing et al. | |
| 10,948,537 B2 | 3/2021 | Forrest et al. | |
| 11,029,176 B2 | 6/2021 | Geiger et al. | |
| 11,115,244 B2 | 9/2021 | Briano et al. | |
| 11,177,814 B2 * | 11/2021 | Kim | H03L 7/0818 |
| 11,252,359 B1 | 2/2022 | Huntington et al. | |

(56) References Cited

U.S. PATENT DOCUMENTS

| | | | |
|---|---|---|---|
| 11,313,899 B2 | 4/2022 | Milano et al. | |
| 11,409,000 B1* | 8/2022 | Behzadi | G01S 7/4913 |
| 11,451,234 B1* | 9/2022 | Austin | H03L 7/0812 |
| 2003/0112913 A1* | 6/2003 | Balasubramanian | H03D 13/004 |
| | | | 375/373 |
| 2004/0169753 A1 | 9/2004 | Gulbransen et al. | |
| 2013/0169329 A1* | 7/2013 | Searles | H03L 7/0816 |
| | | | 327/158 |
| 2013/0176061 A1* | 7/2013 | Haerle | H03L 7/095 |
| | | | 327/142 |
| 2016/0013796 A1* | 1/2016 | Choi | H03L 7/0818 |
| | | | 327/158 |
| 2016/0054434 A1 | 2/2016 | Williams et al. | |
| 2017/0250694 A1* | 8/2017 | Im | H03L 7/0812 |
| 2018/0054206 A1* | 2/2018 | Im | H03L 7/0816 |
| 2018/0068699 A1* | 3/2018 | Choi | H03L 7/0816 |
| 2018/0069367 A1 | 3/2018 | Villeneuve et al. | |
| 2018/0191356 A1 | 7/2018 | Kesarwani | |
| 2018/0191979 A1 | 7/2018 | Mu et al. | |
| 2018/0284239 A1 | 10/2018 | LaChapelle et al. | |
| 2018/0284240 A1 | 10/2018 | LaChapelle et al. | |
| 2018/0284275 A1 | 10/2018 | LaChapelle | |
| 2018/0284280 A1 | 10/2018 | Eichenholz et al. | |
| 2019/0033460 A1* | 1/2019 | Lipson | G01S 17/931 |
| 2019/0310368 A1 | 10/2019 | LaChapelle | |
| 2021/0124050 A1* | 4/2021 | Puglia | G01S 17/10 |
| 2021/0132229 A1 | 5/2021 | Milkov et al. | |
| 2022/0236376 A1* | 7/2022 | Li | G01S 7/484 |
| 2022/0294172 A1 | 9/2022 | Taylor et al. | |

OTHER PUBLICATIONS

U.S. Appl. No. 17/648,702, filed Jan. 24, 2022, Lee et al.
U.S. Appl. No. 17/659,033, filed Apr. 13, 2022, Cadugan et al.
U.S. Appl. No. 17/659,035, filed Apr. 13, 2022, Cadugan et al.
U.S. Appl. No. 17/805,070, filed Jun. 2, 2022, Myers et al.
U.S. Appl. No. 17/809,990, filed Jun. 30, 2022, Quirk et al.
U.S. Appl. No. 17/197,314, filed Mar. 10, 2021, Taylor et al.
U.S. Appl. No. 17/197,328, filed Mar. 30, 2021, Taylor et al.
U.S. Appl. No. 17/230,253, filed Apr. 14, 2021, Judkins, III et al.
U.S. Appl. No. 17/230,276, filed Apr. 14, 2021, Cadugan.
U.S. Appl. No. 17/230,277, filed Apr. 14, 2021, Judkins, III et al.
U.S. Appl. No. 17/352,829, filed Jun. 21, 2021, Huntington et al.
U.S. Appl. No. 17/352,937, filed Jun. 21, 2021, Cadugan et al.
U.S. Appl. No. 17/376,607, filed Jul. 15, 2021, Stewart et al.
U.S. Appl. No. 17/400,300, filed Aug. 12, 2021, Myers et al.
U.S. Appl. No. 17/402,065, filed Aug. 13, 2021, Lee et al.
U.S. Appl. No. 17/566,763, filed Dec. 31, 2021, Huntington et al.
U.S. Appl. No. 17/651,250, filed Feb. 16, 2022, Marshall.
U.S. Appl. No. 17/653,881, filed Mar. 8, 2022, Keuleyan et al.
U.S. Appl. No. 17/656,977, filed Mar. 29, 2022, Myers et al.
U.S. Appl. No. 17/656,978, filed Mar. 29, 2022, Myers et al.
U.S. Appl. No. 17/656,981, filed Mar. 29, 2022, Myers et al.
U.S. Appl. No. 17/657,140, filed Mar. 30, 2022, Myers et al.
U.S. Office Action dated Nov. 23, 2022 for U.S. Appl. No. 17/400,300; 23 pages.

* cited by examiner

DELAY-LOCKED-LOOP TIMING ERROR MITIGATION

STATEMENT REGARDING FEDERALLY FUNDED RESEARCH OR DEVELOPMENT

This invention was made with government support under contract number NNX17CP05C awarded by the National Aeronautics and Space Administration. The government has certain rights in the invention.

BACKGROUND

As is known in the art, lidar imaging systems periodically illuminate target areas or regions with optical energy and detect reflected energy ("returns") in a defined field-of-view (FOV). Lidar systems can use a single laser or multiple lasers to transmit pulses, and single or multiple detectors for sensing and timing the pulse returns. A lidar system's FOV is the portion of the scene that its detectors can sense in a single observation. Lidar systems typically continuously refresh time or range data about the FOV. If any error causes the data to not refresh and instead repeat use of previous data, an unsafe condition may develop where a system utilizing the lidar ranging data could potentially take unsafe actions or fail to respond to changing conditions in the operational FOV of the lidar system. Correctly detecting objects in the FOV or identifying the lidar system's inability to detect objects may be of critical significance for safe operation for lidar systems used in certain applications, such as automotive or aerospace applications.

Lidar imaging systems typically determine range to objects by measuring the round-trip travel time of an optical pulse. This measurement is accomplished with an active pulse detection circuit, or multiple active pulse detections circuits arranged in parallel. The pulse detection time is measured with a time measurement system often including a clocked counter and sometimes a fractional-clock counter.

One method of determining timing within a fraction of a clock is to use a delay-line locked to a clock period with several tap-off points allowing for time measurements at fractions of a clock period. The delay line is typically controlled by a delay-locked-loop (DLL) which produces an error signal used to control a delay on the delay line forcing the delay to match the reference clock period. DLLs can be subject to different types of timing errors. For example, a DLL can lock to a multiple or harmonic of the reference clock period instead of the clock period itself (a.k.a., "false lock"), in which case, the fractional-clock time base can become nonlinear and exhibit discontinuities. In another type of timing error, it is possible for the DLL phase detector to provide a phase error indication opposite of the actual phase error, leading the DLL to drive the delay line to a minimum delay setting in an attempt to drive the delay to zero (a.k.a., "stuck lock"). This condition is typically unrecoverable for the DLL without external intervention. These noted errors can result in significant corruption of lidar range data and may result in an unsafe condition in any system that relies on the lidar data for safety-related applications.

SUMMARY

Embodiments of the present disclosure is directed to and includes delay-locked loop (DLL) timing error mitigation.

One aspect of the present disclosure is directed to a delay-locked-loop (DLL) false-lock detection system. The system can include DLL circuitry configured to receive a reference clock signal, where the reference clock signal includes a clock cycle having a period (T). The DLL circuitry can produce a delay clock signal as a delayed replica of the reference clock signal on a delay line. The delay line can be controlled by a delay line control signal to match the clock cycle of the reference clock signal. The DLL circuitry can include a phase detector configured to measure a phase difference between the reference clock signal and the delay clock signal. The phase detector can be configured to produce up and down signals (e.g., pulses) for controlling a delay of the delay clock signal on the delay line relative to the reference clock signal.

The system can include a test pulse generator configured to produce an output pulse, where the output pulse has a pulse width of a single clock period of the reference clock signal. The system can include a reference delay line configured to receive the output pulse from the test pulse generator and the delay line control signal from the DLL circuitry. The reference delay line can be configured to produce an output pulse having the same delay as the delay line of the DLL circuitry relative to the reference clock signal. The system can include shift register circuitry including a plurality of (N) serially connected stages. The shift register circuitry can be configured to receive the output pulse from the test pulse generator and the reference clock signal from the DLL circuitry. Each shift register stage can respectively produce an output pulse aligned with a different multiple of the clock period of the reference clock signal. The system can include a plurality of latched comparison circuits corresponding in number (N) to the stages of the shift register circuitry. Each latched comparison circuit can be configured to receive the output pulse of the reference delay line and an output pulse from a respective stage of the shift register circuitry. Each latched comparison circuit can perform a comparison to evaluate whether the received pulses are matched and produce a respective matched-pulse indication when the pulses are matched. The respective matched-pulse indication indicates a locked condition to a respective multiple (1)–(N) of the reference clock signal period (T).

Example embodiments may include one or more of the following features. The system may include lock-state detection circuitry configured to compare the up and down pulses and determine when the DLL circuitry is in a locked condition. the locked state detection circuitry can be configured to produce a locked status signal indicating that the DLL circuitry is in a locked condition when the up and down pulses are substantially identical. The DLL circuitry may include charge pump and loop filter circuitry configured to convert the up and down pulses into the delay line control signal for controlling the delay clock signal. Each stage of the shift register circuitry may include a flip flop circuit. Each flip flop circuit may include an edge-triggered flip flop circuit. The edge-triggered flip flop can be configured as a rising-edge flip flop circuit. Each of the plurality of latched comparison circuits may include a pair of serially connected flip flop circuits. The test pulse generator can be configured to generate the output pulse in response to a lock check input signal. The reference delay line may include a matched copy of the delay line of the DLL circuitry. The delay through the reference delay line may include a multiple of the reference clock period. The delay through the reference delay line can equal the reference clock period. A respective multiple of 1T can indicate a correct lock condition. A respective multiple of greater than or equal to 2T can indicate a false-lock condition. The delay line may include a plurality of adjustable delay elements connected in series. The delay line may be configured to form fractional clock period timing between the individual adjustable delay elements.

The lock-state detection circuitry may include a first comparator configured to receive the up and down pulses from the phase detector and produce as an output a different-state signal indicative of when the up and down signals pulses are different. The lock-state detection circuitry can include a second comparator configured to receive the up and down pulses from the phase detector and produce an output trigger signal indicative of when the up and down pulses are substantially equal. The lock-state detection circuitry can include a delay line configured to receive the different-state signal from the first comparator and to produce delayed version of the different-state signal as an output. The lock-state detection circuitry can include a latch configured to produce an output signal in response to the trigger signal from the second comparator. The first comparator may include an exclusive NOR gate. The second comparator may include an AND gate. The delay line of the lock-state detection circuitry can be programmable to delay the different-state signal by a desired delay (D). Implementations of the described techniques may include hardware, a method or process, or computer software on a computer-accessible medium.

Another aspect of the present disclosure is directed to a delay-lock-loop (DLL) phase detector stuck-lock avoidance system/circuit. The system/circuit can include DLL circuitry configured to receive a reference clock signal, where the reference clock signal includes a clock cycle having a period. The DLL circuitry can include a delay line. The DLL circuitry can be configured produce a delay clock signal on the delay line controlled by a delay line control signal to match the clock cycle of the reference clock signal. The stuck-lock avoidance system/circuit can include first-edge detection circuitry configured to receive the reference clock signal and produce an output pulse in response to a first edge of the reference clock signal, where the output pulse is produced after a predetermined delay. The system/circuit can include phase detector circuitry configured to receive the reference clock signal and the delay clock signal, and to compare when a first edge of each of the respective signals is received. The phase detector circuitry can be further configured to produce up and down pulses for controlling a delay of the delay clock signal on the delay line relative to the reference clock signal. The phase detector circuitry can be configured to receive the output pulse from the first-edge detection circuitry and, in response, to disregard a first pulse of the reference clock signal.

Example embodiments may include one or more of the following features. The phase detector circuitry can include first and second edge-sensitive input circuit elements configured to receive the reference clock signal and the delay clock signal, respectively, and to produce the up and down pulses, respectively, in response to detecting a signal-state transition edge. The first and second edge-sensitive input circuit elements may include first and second latches configured in parallel. The first and second latches may include rising-edge sensitive latches. The phase detector circuitry further may include reset logic configured to provide a reset signal to the first and second edge-sensitive input circuit elements for resetting the phase detector. The phase detector circuitry can include comparison logic configured to identify when each of the edges has been received. The comparison logic may include a NAND gate. The DLL circuitry may include charge pump and loop filter circuitry configured to convert the up and down pulses into the delay line control signal for controlling the delay clock signal. The first-edge detection circuitry may include first and second edge-sensitive latches in series. The first-edge detection circuitry may include a delay element configured to receive an output of the second edge-sensitive latch and produce the output pulse after the predetermined delay. The delay line may include a plurality of adjustable delay elements connected in series and configured to form fractional clock period timing between the individual adjustable delay elements. Implementations of the described techniques may include hardware, a method or process, or computer software on a computer-accessible medium.

Example embodiments of the present disclosure are directed to and provide DLL timing error mitigation systems, circuits, and/or methods for, e.g., specification of an Application Safety Integration Level (ASIL) in compliance with a safety standard such as ISO 26262 or the like.

Example embodiments can include a system of one or more computers that can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

Figure 1:
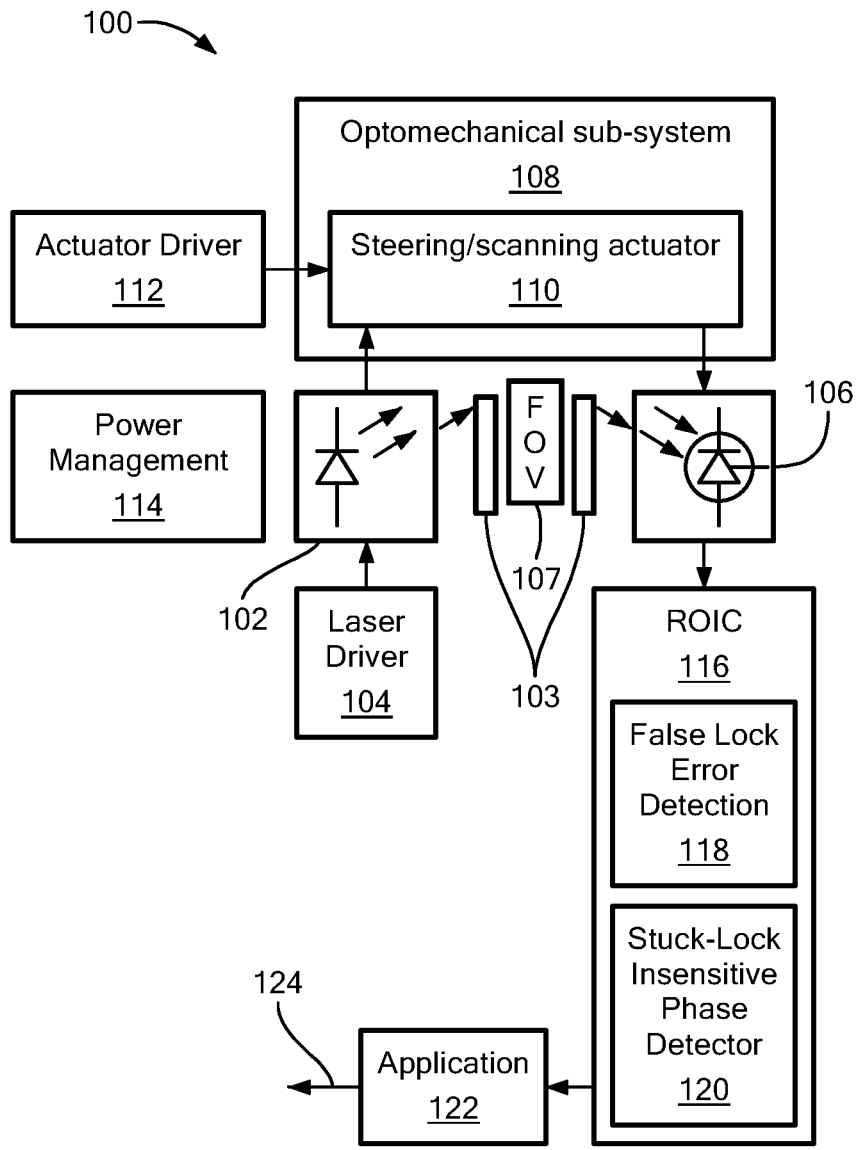
FIG. 1 is a block diagram showing major components of an example embodiment of a lidar system, in accordance with the present disclosure.

Prior to describing example embodiments of the present disclosure some information is provided. Laser ranging systems can include laser radar (ladar), light-detection and ranging (lidar), and range-finding systems, which are generic terms for the same class of instruments that use light to measure the distance to objects in a scene. This concept is similar to radar, except optical signals are used instead of radio waves. Similar to radar, a laser ranging and imaging system emits a pulse toward a particular location and measures the return echoes (reflections) to extract the range.

Laser ranging systems generally work by emitting a laser pulse and recording the time it takes for the laser pulse to travel to a target, reflect, and return to a photoreceiver, which time is commonly referred to as the "time of flight." The laser ranging instrument records the time of the outgoing pulse—either from a trigger or from calculations that use measurements of the scatter from the outgoing laser light—and then records the time that a laser pulse returns. The difference between these two times is the time of flight to and from the target. Using the speed of light, the round-trip time of the pulses is used to calculate the distance to the target.

Lidar systems may scan the beam (or, successive pulses) across a target area to measure the distance to multiple points across the field of view, producing a full three-dimensional range profile of the surroundings. More advanced flash lidar cameras, for example, contain an array of detector elements, each able to record the time of flight to objects in their field of view.

Lidar systems can use a single laser or multiple lasers to transmit pulses, and single or multiple detectors for sensing and timing the pulse returns. A lidar system's field-of-regard (FOR) is the portion of a scene that it can sense over multiple observations, whereas its field-of-view (FOV) is the portion of the scene that its detectors can sense in a single observation. Depending on type of lidar system, the FOV of its detectors may be scanned over its FOR over multiple observations ("scanned lidar"), or in a "staring" system the detector FOV may match the FOR, potentially updating the scene image with every observation. However, during a single observation, a lidar system can only sense the parts of its detector FOV that are illuminated by its laser. The area of the scene illuminated by a single laser pulse may be scanned over the detector FOV, necessitating multiple observations to image the part of the scene within that FOV, or it may be matched to the detector FOV ("flash lidar") and either scanned along with the FOV over a larger FOR, or it may illuminate the entire FOR in a staring flash lidar system. These lidar system architectures differ with respect to how much laser energy per pulse is needed, how fast the laser must pulse, and how rapidly a three-dimensional image of a given FOR can be collected.

In scanned lidar systems, the returns collected by each detector of the sensor (each constituting a point in the FOR) are aggregated over multiple laser shots to build up a "point cloud" in three-dimensional space that maps the topography of the scene. In staring flash lidar systems a complete point cloud is collected with every laser shot. Lidar system architecture with respect to scanning versus staring detectors and scanning versus flash illumination are driven by issues such as the required angular span and resolution of the scene to be imaged, the available power and achievable pulse repetition frequency of the laser, the range over which the lidar system must be effective, and the desired image update rate, among many other factors. Often it is impractical to supply sufficient laser pulse energy per pixel to implement long-range flash lidar in a high-resolution staring system, whereas illuminating too small of a FOV limits the image update rate of high-resolution, wide-FOR scanned lidar systems. Lidar systems that match sensor FOV and laser illumination to the full extent of the FOR along one axis of the scene, such as angle-of-elevation, while scanning across the FOR along the other axis, such as azimuthal angle, provide an engineering compromise that limits required laser power while supporting very high image resolution and update rates.

When using light pulses to create images, the emitted pulse may intercept multiple objects, at different orientations, as the pulse traverses a 3D volume of space. The reflected (or echoed) laser-pulse waveform contains a temporal and amplitude imprint of the scene. By sampling the light reflections or echoes, a record of the interactions of the emitted pulse is extracted with the intercepted objects of the scene, allowing an accurate multi-dimensional image to be created. To simplify signal processing and reduce data storage, laser ranging and imaging can be dedicated to discrete-return systems, which record only the time of flight (TOF) of the first, or a few, individual target returns to obtain angle-angle-range images.

In a discrete-return system, each recorded return corresponds, in principle, to an individual laser reflection (i.e., an echo from one particular reflecting surface, for example, a tree, pole or building). By recording just a few individual ranges, discrete-return systems simplify signal processing and reduce data storage, but they do so at the expense of lost target and scene reflectivity data. Because laser-pulse energy has significant associated costs and drives system size and weight, recording the TOF and pulse amplitude of more than one laser pulse return per transmitted pulse, to obtain angle-angle-range-intensity images, increases the amount of captured information per unit of pulse energy. All other things equal, capturing the full pulse return waveform offers significant advantages, such that the maximum data is extracted from the investment in average laser power. In full-waveform systems, each backscattered laser pulse received by the system is digitized at a high sampling rate (e.g., 500 MHz to 1.5 GHz). This process generates digitized waveforms (amplitude versus time) that may be processed to achieve higher-fidelity 3D images.

Of the various laser ranging instruments available, those with single-element photoreceivers generally obtain range data along a single range vector, at a fixed pointing angle. This type of instrument—which is, for example, commonly used by golfers and hunters—either obtains the range (R) to one or more targets along a single pointing angle or obtains the range and reflected pulse intensity (I) of one or more objects along a single pointing angle, resulting in the collection of pulse range-intensity data, $(R,I)_i$, where i indicates the number of pulse returns captured for each outgoing laser pulse.

More generally, laser ranging instruments can collect ranging data over a portion of the solid angles of a sphere, defined by two angular coordinates (e.g., azimuth and elevation), which can be calibrated to three-dimensional (3D) rectilinear cartesian coordinate grids; these systems are generally referred to as 3D lidar and ladar instruments. The terms "lidar" and "ladar" are often used synonymously and, for the purposes of this discussion, the terms "3D lidar,"

"scanned lidar," or "lidar" are used to refer to these systems without loss of generality. 3D lidar instruments obtain three-dimensional (e.g., angle, angle, range) data sets. Conceptually, this would be equivalent to using a rangefinder and scanning it across a scene, capturing the range of objects in the scene to create a multi-dimensional image. When only the range is captured from the laser pulse returns (reflections), these instruments obtain a 3D data set (e.g., angle, angle, range)$_n$, where the index n is used to indicate that a series of range-resolved laser pulse returns can be collected, not just the first reflection.

Some 3D lidar instruments are also capable of collecting the intensity of the reflected pulse returns generated by the objects located at the resolved (angle, angle, range) objects in the scene. When both the range and intensity are recorded, a multi-dimensional data set (e.g., angle, angle, (range-intensity)$_n$) is obtained. This is analogous to a video camera in which, for each instantaneous field of view (FOV), each effective camera pixel captures both the color and intensity of the scene observed through the lens. However, 3D lidar systems, instead capture the range to the object and the reflected pulse intensity.

Lidar transmitters produce emissions (laser outputs) that are generally invisible to the human eye. For example, lidar systems can include different types of lasers operating at different wavelengths, including those that are not visible (e.g., wavelengths of 840 nm or 905 nm), in the near-infrared (e.g., at wavelengths of 1064 nm or 1550 nm), and in the thermal infrared including wavelengths known as the "eye-safe" spectral region (generally those beyond 1300-nm), where ocular damage is less likely to occur. However, when the wavelength of the laser is close to the range of sensitivity of the human eye—the "visible" spectrum, or roughly 350 nm to 730 nm, it is desirable to lower the energy of the laser pulse and/or the average power of the laser below certain thresholds (e.g., as recognized by certain safety standards) to avoid causing ocular damage.

Certain industry standards and/or government regulations define "eye safe" energy density or power levels for laser emissions, including those at which lidar systems typically operate. For example, industry-standard safety regulations IEC 60825-1: 2014 and/or ANSI Z136.1-2014 define maximum power levels for laser emissions to be considered "eye safe" under all conditions of normal operation (i.e., "Class 1"), including for different lidar wavelengths of operation. The power limits for eye safe use vary according to wavelength due to absorption characteristics of the structure of the human eye. For example, because the aqueous humor and lens of the human eye readily absorb energy at 1550 nm, little energy reaches the retina at that wavelength. Comparatively little energy is absorbed, however, by the aqueous humor and lens at 840 nm or 905 nm, meaning that most incident energy at that wavelength reaches and can damage the retina. Thus, a laser operating at, for example, 1550 nm, can—without causing ocular damage—generally have 200 times to 1 million times more laser pulse energy than a laser operating at 840 nm or 905 nm.

One challenge for a lidar system is detecting poorly reflective objects at long distance, which requires transmitting a laser pulse with enough energy that the return signal—reflected from the distant target—is of sufficient magnitude to be detected. To determine the minimum required laser transmission power, several factors should be considered. For instance, the magnitude of the pulse returns scattering from the diffuse objects in a scene is proportional to their range and the intensity of the return pulses generally scales with distance according to $1/R^4$ for small objects and $1/R^2$ for larger objects; yet, for highly-specularly reflecting objects (i.e., those objects that are not diffusively-scattering objects), the collimated laser beams can be directly reflected back, largely unattenuated. This means that—if the laser pulse is transmitted, then reflected from a target that is immediately in front of the transmitting laser, e.g., 1 meter away—it is possible that the full energy (J) from the laser pulse will be reflected into the photoreceiver; but—if the laser pulse is transmitted, then reflected from a target that is farther away, e.g., 333 meters away—it is possible that the return will have a pulse with energy approximately $10^{12}$ weaker than the transmitted energy. To provide an indication of the magnitude of this scale, the 12 orders of magnitude ($10^{12}$) is roughly the equivalent of: the number of inches from the Earth to the sun, or the ratio of the luminous output from a phosphorescent watch dial, one hour in the dark, to the luminous output of the solar disk at noon.

In many cases, lidar systems utilize highly sensitive receivers (photoreceivers) to increase the system sensitivity and reduce the amount of laser pulse energy that is needed to reach (and return from) poorly reflective targets at the longest distances required, and to maintain eye-safe operation. Some variants of these detectors include those that incorporate photodiodes, and/or offer gain, such as avalanche photodiodes (APDs) or single-photon avalanche detectors (SPADs). These variants can be configured as single-element detectors, —segmented-detectors, linear detector arrays, or area detector arrays. Using highly sensitive detectors such as APDs or SPADs reduces the amount of laser pulse energy required for long-distance ranging to poorly reflective targets. A technological challenge of these photodetectors is that they should also be able to accommodate the incredibly large dynamic range of signal amplitudes.

As dictated by the properties of the optics, the focus of a laser return changes as a function of range; as a result, near objects are often out of focus. Furthermore, also as dictated by the properties of the optics, the location and size of the "blur"—i.e., the spatial extent of the optical signal—changes as a function of range, much like in a standard camera. These challenges are commonly addressed by using large detectors, segmented detectors, or multi-element detectors to capture all of the light or just a portion of the light over the full-distance range of objects. It is generally advisable to design the optics such that reflections from close objects are blurred, so that a portion of the optical energy does not reach the detector or is spread between multiple detectors. This design strategy can reduce the dynamic range requirements of the detector and prevents the detector from damage.

Acquisition of the lidar imagery can include, for example, a 3D lidar system embedded in the front of car, where the 3D lidar system, includes a laser transmitter with any necessary optics, a single-element photoreceiver with any necessary dedicated or shared optics, and an optical scanner used to scan ("paint") the laser over the scene. Generating a full-frame 3D lidar range image—where the field of view is 20 degrees by 60 degrees and the angular resolution is 0.1 degrees (10 samples per degree)—can require emitting 120,000 pulses (20*10*60*10=120,000). When update rates of 30 frames per second are required, such as is commonly required for automotive lidar, roughly 3.6 million pulses per second must be generated and their returns captured.

There are many ways to combine and configure the elements of the lidar system— including considerations for the laser pulse energy, beam divergence, detector array size and array format (e.g., single element, linear (1D) array, or 2D array), and scanner to obtain a 3D image. If higher power lasers are deployed, pixelated detector arrays can be used, in which case the divergence of the laser would be mapped to a wider field of view relative to that of the detector array, and the laser pulse energy would need to be increased to match the proportionally larger field of view. For example, compared to the 3D lidar above, to obtain same-resolution 3D lidar images 30 times per second, a 120,000-element detector array (e.g., 200×600 elements) could be used with a laser that has pulse energy that is 120,000 times greater. The advantage of this "flash lidar" system is that it does not require an optical scanner; the disadvantages are that the larger laser results in a larger, heavier system that consumes more power, and that it is possible that the required higher pulse energy of the laser will be capable of causing ocular damage. The maximum average laser power and maximum pulse energy are limited by the requirement for the system to be eye-safe.

As noted above, while many lidar system operate by recording only the laser time of flight and using that data to obtain the distance to the first target return (closest) target, some lidar systems are capable of capturing both the range and intensity of one or multiple target returns created from each laser pulse. For example, for a lidar system that is capable of recording multiple laser pulse returns, the system can detect and record the range and intensity of multiple returns from a single transmitted pulse. In such a multi-pulse lidar system, the range and intensity of a return pulse from a from a closer-by object can be recorded, as well as the range and intensity of later reflection(s) of that pulse— one(s) that moved past the closer-by object and later reflected off of more-distant object(s). Similarly, if glint from the sun reflecting from dust in the air or another laser pulse is detected and mistakenly recorded, a multi-pulse lidar system allows for the return from the actual targets in the field of view to still be obtained.

The amplitude of the pulse return is primarily dependent on the specular and diffuse reflectivity of the target, the size of the target, and the orientation of the target. Laser returns from close, highly-reflective objects, are many orders of magnitude greater in intensity than the intensity of returns from distant targets. Many lidar systems require highly sensitive photodetectors, for example avalanche photodiodes (APDs), which along with their CMOS amplification circuits. So that distant and poorly-reflective targets may be detected, the photoreceiver components may be optimized for high conversion gain. Largely because of their high sensitivity, these detectors may be damaged by very intense laser pulse returns.

For example, if an automotive equipped with a front-end lidar system were to pull up behind another car at a stoplight, the reflection off of the license plate may be significant— perhaps 10´12 higher than the pulse returns from targets at the distance limits of the lidar system. When a bright laser pulse is incident on the photoreceiver, the large current flow through the photodetector can damage the detector, or the large currents from the photodetector can cause the voltage to exceed the rated limits of the CMOS electronic amplification circuits, causing damage. For this reason, it is generally advisable to design the optics such that the reflections from close objects are blurred, so that a portion of the optical energy does not reach the detector or is spread between multiple detectors. However, capturing the intensity of return pulses over a larger dynamic range associated with laser ranging may be challenging because the signals are too large to capture directly. Signal intensity can be inferred (deduced) by using a recording of a bit-modulated output obtained using serial-bit encoding obtained from one or more voltage threshold levels. This technique is often referred to as time-over-threshold (TOT) recording or, when multiple-thresholds are used, multiple time-over-threshold (MTOT) recording.

FIG. 1 is a block diagram showing major components of an example embodiment of a lidar system 100, in accordance with the present disclosure. System 100 can include a scanned lidar system in some embodiments, a flash lidar system in other embodiments, or a hybrid (scanning/flash) system in still other embodiments. System 100 includes an illumination source 102, shown as laser diode, connected to laser driver 104. Optics 103 are shown and can be used for the illumination source 102 and/or receiver 106 (e.g., in monostatic or bistatic configurations). The illumination source (e.g., a laser or LED) 102 produces an output (e.g., one or more laser pulses). Appropriate pumping energy may be supplied by suitable sources, e.g., diodes lasers, for the case where laser 102 includes a non-semiconductor active medium. An optical receiver (e.g., detector) 106, shown as a representative photodiode, receives laser returns (reflections of the laser outputs) from objects and/or surfaces in the FOV 107.

The detector 106 can include an array of individual detectors, e.g., a one-dimensional array (1×N) or a two-dimensional array (M×N). A field-of-view (FOV) 107 of the detector is shown on the optical path between the laser (illumination source) 102 and the detector 106, which is directed to and "viewing" the FOV 107. Detector 106 operates to detect energy reflected from objects and/or surfaces in the FOV 107. An optomechanical subsystem 108, e.g., a steering/scanning actuator 110 for transmit beam steering, can be included to scan the illumination source 102 and detector 106 in one or more directions. An actuator driver 112 can control the movement of the actuator 110. While embodiments of system 100 can be configured as scanning lidar systems, other embodiments of system 100 can be configured as flash lidar systems not utilizing steering/scanning such that optomechanical subsystem 108 or subcomponents 110 and/or 112 may be omitted.

System 100 further includes a power management block 114, which provides and controls power to the system 100. Once received at the detector 106, the incident photons are converted by the detector 106 (e.g., photodiodes) to electrical signals, which can be read-out by the system for signal processing. A readout integrated circuit or circuitry (ROIC) 116 is shown connected to receiver (optical detector) 106 for receiving the output from the detector 106. ROIC 116 can be used for, e.g., amplification, discrimination, timing, and/or digitization. A false-lock error detection block 118 and/or a stuck-lock insensitive (robust) phase detector block 120 can be used for determination of correct or incorrect timing functionality, as described in further detail below. In example embodiments, blocks 118 and/or 120 can be included in (e.g., integrated into) ROIC 116, as shown. The term ROIC as used herein can include reference to a digital ROIC (DROIC) or a digital pixel ROIC (DPROIC) and embodiments of ROIC 116 can include or be configured as, e.g., a DROIC or a DPROIC. One or more additional signal processing blocks (not shown) may be used for further signal processing of the signals generated from the returns. The data can be passed to one or more systems or applications 122 for further use, e.g., for point cloud generation by an autonomous vehicle control system, etc. An output data stream 124 can include lidar range data (e.g., range/amplitude information) and/or metadata information including any detected fault(s) within the lidar sensor—including false-lock faults, as described further detail below.

Implementation of lidar systems, e.g., similar to system 100 in FIG. 1, in automotive or other safety-sensitive applications can require meeting one or more safety standards such, e.g., ISO 26262, which includes specification of an Application Safety Integration Level (ASIL). Embodiments of the present disclosure provide systems, circuits, and methods for identifying and addressing timing errors associate with a DLL used for lidar timing.

Figure 2:
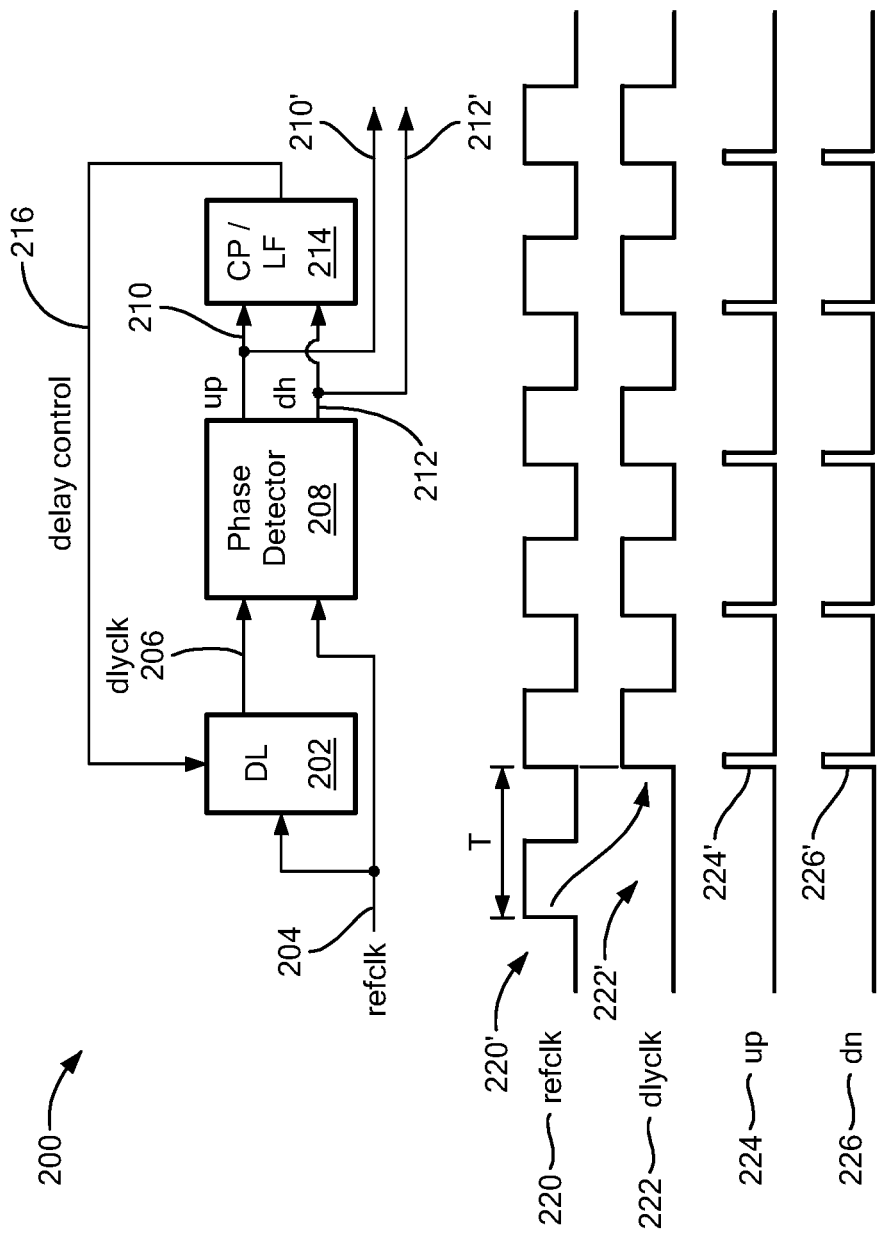
FIG. 2 is a block diagram of an example DLL system/circuit having connections for use with a DLL false-lock detection system/circuit, in accordance with the present disclosure.

FIG. 2 is a block diagram of an example DLL system/circuit 200 having connections for a DLL false-lock detection system/circuit, in accordance with the present disclosure. System/circuit 200 can include a delay line (DL) 202 and an input (e.g., reference clock signal) from a reference clock 204. Delay line 202 can include an arbitrary number (N) of individual delay elements (not shown). Delay line 202 can be configured to receive the reference clock signal and produce a delayed version (delay clock signal) as an output 206. System/circuit 200 can include a phase detector 208 that is configured to receive the reference clock signal 204 and the delay clock signal 206 as inputs and detect a phase difference between those two input signals. System/circuit 200 can also include a charge pump and loop filter (CP/LF) 214. In example embodiments, DLL system/circuit 200 may be configured to provide for fractional timing, e.g., a fractional time base relative to a reference clock period. Delay line 202 is configured to receive a command signal, e.g., as shown by delay control line 216, for controlling the amount of delay produced by the delay line 202.

The phase detector 208 can produce output signals (e.g., pulses), corresponding to the detected phase difference, on output lines 210, 212 (indicated as "up" and "down," respectively.) Charge pump and loop filter (CP/LF) 214 can receive the up and down pulses and is configured to produce the delay control signal 216 to control the delay on the delay line 202. System/circuit 200 can also include connections 210', 212' providing outputs from the phase detector 208 for use by other systems/circuits, including but not limited to a lock-state detect system/circuit, e.g., as shown and described for FIG. 4.

Circuit/system 200 compares the reference clock signal 220 (initial pulse indicated as 220') to the delayed clock signal 222 (initial pulse indicated as 222') and controls (servo-controls) the delay control input 216 for the delay line 202 used to generate the delayed clock signal 222. The phase error between the reference clock and delay clock is measured with the phase detector (PD) circuit 208 which produces "up" and "down" pulses 224, 226, the relative pulse width of which indicate the desired modification direction of the delay line 202. The charge pump and loop filter (CP/LF) 214 converts these pulses into a voltage control signal 216 which is fed back to the delay line 202 as a delay control input 216. When the delay 202 is "locked" to a multiple of the reference clock period, the phase detector outputs 224, 226 form essentially identical up and down pulses and the charge pump 208 and loop filter (CP/LF) 214 do not produce a change in the delay control in this condition.

The example reference clock and delay clock signals 220 and 222 indicate that the delay on the delay clock signal 222 compared to the reference clock signal 220 is one period (T). The up and down signals 224, 226 (e.g., as produced by PD 208) are shown as including pulses having equal pulse widths 224', 226', indicating a locked condition between the delay clock signal 222 and the reference clock signal 220. Because the up and down signals 224, 226 have equal widths, the control signal from the charge pump and loop filter (CP/LF) 214 would not produce a change in the delay control in this condition. As noted above, up and down signals 224, 226 can be provided, e.g., by connections 210' and 212', to additional circuitry for determining whether a locked condition or state exists between the reference clock signal 220 and the delay clock signal 222.

Embodiments of the present disclosure can generally use DLL locked delay lines, e.g., as shown in FIG. 2, for extracting timing information from signals. One specific example (among many) can include use for time-to-digital conversion. For example, embodiments may use a DLL locked delay line for input signal delay sampling. In an example embodiment, an input to be timed can be passed though the matched delay-line and the delay line state sampled with reference to a clock having the same period as the delay line. This can provide sub-clock-period timing information on the arrival of the event to be timed. The sub-clock phase information can be combined with a clock counter to get a timing measurement with more resolution than the clock period.

DLL locked delay lines may also be used for clock signal sub-phase generation. For example, a matched delay-line (matched to another DL having a reference clock) can be used to generate multiple clock phases of the reference clock which are shifted in time from one-another by the delay between each delay line element. For example, 16 delay elements in the delay lines allows for 16 clock phases all shifted by 1/16*clock period (T) respective to each other. These clocks can then be sampled by the incoming event and used to determine event arrival with accuracy related to clock sub-phase. The sub-clock phase information can be combined with a clock counter to get a timing measurement with more resolution than the clock period.

Figure 3:
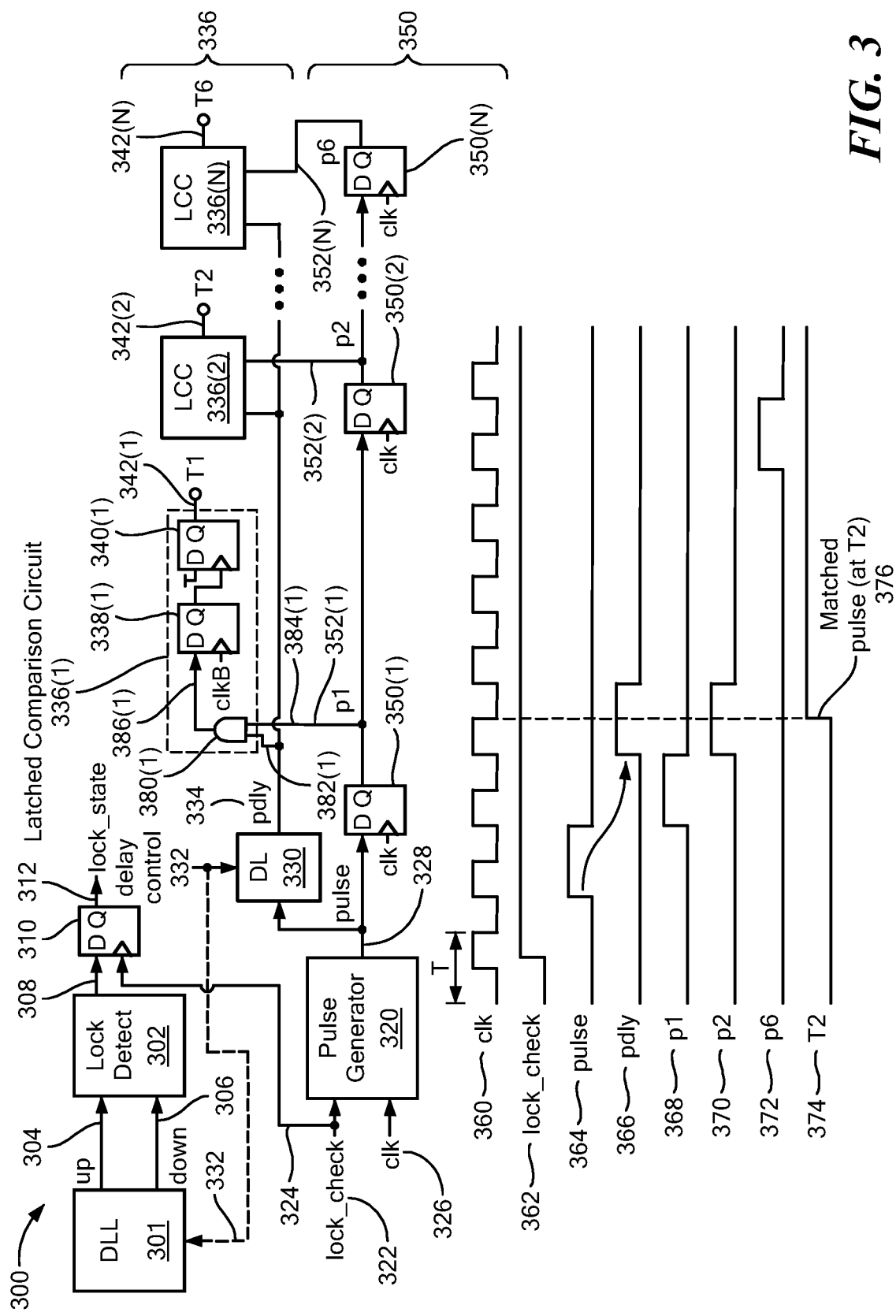
FIG. 3 is a block diagram of an example DLL false-lock detection system/circuit, in accordance with the present disclosure.

As noted previously, embodiments of the present disclosure can be used to detect and address DLL timing errors, including false-lock conditions occurring when a DLL has locked on an incorrect multiple of a reference clock period. FIG. 3 shows one example.

FIG. 3 shows an example DLL false-lock detection system/circuit 300, in accordance with the present disclosure. System/circuit 300 can include a delay-locked loop (DLL) circuit 301, DLL locked-state detection circuitry 302, a test pulse generator 320, a reference delay line 330, a comparison circuit 336 having a plurality of latched comparison circuits 336(1)-(N), and a shift register 350 including a plurality of flip-flops 350(1)-(N). In example embodiments, DLL circuit 301 can be the same as or similar to system/circuit 200 of FIG. 2.

The DLL false-lock detection system/circuit 300 operation is based on the DLL 301 (or similar DLL) being in a locked state, or nearly locked state within given or programmable tolerances, to produce a reliable measurement of the false-lock state. The DLL locked-state detection circuitry 302 can determine whether a locked state exists by comparing the "up" and "down" signals 304, 306 from DLL 301 (e.g., as produced by an included phase detector and charge pump and loop filter). If DLL 301 is in a locked condition, up and down signals 304, 306 will be substantially identical in alignment and pulse width. If the up and down signals 304, 306 indicate a locked condition, circuit 302 can produce a "locked" status signal which may be delivered, e.g., to a status checking system. Alternatively, the "locked" status may be first sampled with an inquiry signal (e.g., "lock_check" signal) to store the status at the moment of the inquiry signal arrival.

While DLL locked-state detection circuitry 302 can determine whether a locked condition or state exists the circuitry 302 may not be able to distinguish between DLL 301 being locked in a single-clock-period lock condition (i.e., 1T) or a multiple-clock-period lock condition (e.g., 2T, 3T, etc.). As explained below, test pulse generator 320, reference delay line 330, comparison circuit 336, and a shift register 350 can determine a lock period for a locked condition of DLL 301.

The test pulse generator 320 can produce a test pulse 328, e.g., having a pulse width of a single clock period (T), which is aligned with the same reference clock 326 used in the DLL 301. Pulse 328 can then be delivered to the reference delay line DL 330 and the shift register 350. In example embodiments, test pulse generator can generate a test pulse 328 in response to a lock check inquiry (e.g., "lock_check").

The reference delay line 330 can be a matched copy of the delay line (DL) used in the DLL 301, including the same physical structure, e.g., number of delay elements (not shown). The delay control 332 provided to the delay line in the DLL 301 can also be provided to the reference delay line 330 as shown. This makes the delay from the input to output of the reference delay line 330 identical to (or essentially identical to) the DLL delay line 301. The test pulse 328 provided by the pulse generator 320 propagates though the delay line 330 with the same overall delay as the delay line in the DLL 301. When the DLL 301 is in a locked state, e.g., as indicated by lock detect circuit 302, the delay through the reference delay line 330 will either be equal to the reference clock period (T) or a multiple of the reference clock period (2T, 3T, 4T, etc.).

Shift register 350 includes a set of serially connected latches or flip-flops 350(1)-(N) all operating on the same clock edge using the same reference clock used by the DLL 301 and the pulse generator 320. Shift register 350 can receive the pulse 328 from the pulse generator 320—shown at input of flip-flop 350(1)— and propagate the pulse 328 to a successive stage of the shift register 350 on each subsequent clock pulse. As a result, each stage 350(1)-(N) of the shift register 350 produces an output pulse aligned with a respective multiple of the reference clock period (T). For example, stage 350(1) would produce an output pulse 352(1) at t=1T, stage 350(2) would produce an output pulse 352(2) at t=2T, stage 350(3) would produce an output pulse 352(3) at t=3T, etc. These pulse outputs 352(1)-(N) are sent to respective latched comparison circuits 336(1)-(N) for comparison with the delayed pulse 334 on the reference delay line (DL) 330.

The latched comparison circuits 336(1)-(N) have outputs 342(1)-(N) and each receives the output of the reference delay line and a respective one of the shift register outputs 352(1)-(N). Each latched comparison circuit, e.g., 336(1), evaluates whether delay pulse 334 from the delay line 330 matches the pulse 328 received from the corresponding shift register, e.g., 350(1). For example, latched comparison circuit 336(1) is shown including AND gate 380(1) which is configured to receive delay pule 334 on a first input 382(1) and output pulse 352(1) from stage 350(1) on a second input 384(1). AND gate 380(1) is configured to perform an AND logical comparison and provide a corresponding output 386(1) of the logical comparison to flip-flop (latch) 338(1). The output of this logical comparison can then be sampled by flip-flop 338(1), which may use the opposite clock edge (e.g., CLKB) as a pulse transition, e.g., to ensure any small variations in the delay line delay 330 do not cause violation of setup or hold requirements. If the output of the sampled comparison indicates a matched pulse, the result can be stored, e.g., in a different latch 340(1), for retrieval by a status checking system.

Whichever latched comparison circuit 350(1)-(N) indicates a matched pulse also indicates the locking period (in multiples of the reference clock period, T) of the locked condition of DLL 301. For example, a matched pulse captured in the first latched comparison circuit 350(1) would indicate a DLL lock condition at a one-clock-period (1T) delay setting (i.e., normal or a desired lock condition), while a matched pulse captured in a later latched comparison circuit, e.g., 350(2), would indicate a lock condition having a multiple-clock-period, e.g., 2T, delay setting, corresponding to a false-lock error condition. The false-lock period (N*T, N>1) of the false-lock condition will be indicated by whichever latched comparison circuit 350(1)-(N) indicates a match. For example, representative waveforms 360-374, explained in further detail below, indicate a matched pulse for the second latched comparison circuit 336(2), corresponding to a false-lock condition where the DLL 301 is locked to twice the clock period (2T) of the reference clock.

Reference clock waveform 360 is shown with pulses having period T. Lock check signal 362 is shown as is pulse 364 (generated by pulse generator 360). Delay pulse 366 is shown, as produced by delay line 330. The pulses from the individual latches 350(1)-(N) are shown by 368, 370, and 372 for pulses p1, p2, and p6, respectively (pulses p3-p5 are omitted for brevity). The comparison for p2, as would be performed by latched comparison circuit 336(2), indicates that a matched pulse 376 has been detected at T2. Matched pulse 376 is shown being generated on the falling edge of the clock cycle 360 as indicated by matched pulse 376 occurring at the midpoint of p2 370. Once the locked status and the clock multiple state are checked and/or ascertained, the system/circuit 300 can be reset, in which case it will then be ready for another check, e.g., as triggered by an external controller.

Accordingly, the locking state of a DLL, e.g., DLL 301, may be periodically checked, e.g., while a related or associated lidar system is in operation. The time between the development of an unsafe condition and the observation and flagging of the unsafe condition may be managed, e.g., by an external controller (not shown) that triggers or sets the times at which lock-check signal 322 causes system/circuit 300 to initiate a test pulse 328 to check the lock period of the DLL 301. System/circuit 300 can accordingly allow a lidar system utilizing the DLL 301 to communicate an unsafe false-lock condition to a system or application using the output data stream and can also be utilized when such a condition is encountered to provide a triggered or automated response to return a DLL locking point to a correct position. In example embodiments, an output data stream (e.g., 124 in FIG. 1) can include lidar range data (e.g., range/amplitude information) and/or metadata information including any detected fault(s) within the lidar sensor—including false-lock faults.

Figure 4:
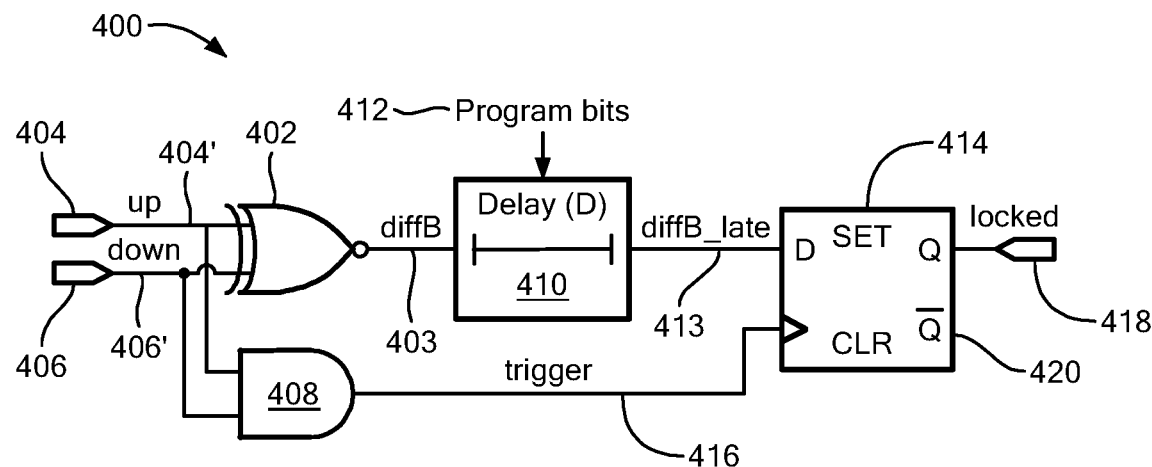
FIG. 4 is a block diagram of an example lock-state detection system/circuit, in accordance with the present disclosure.
Figure 4:
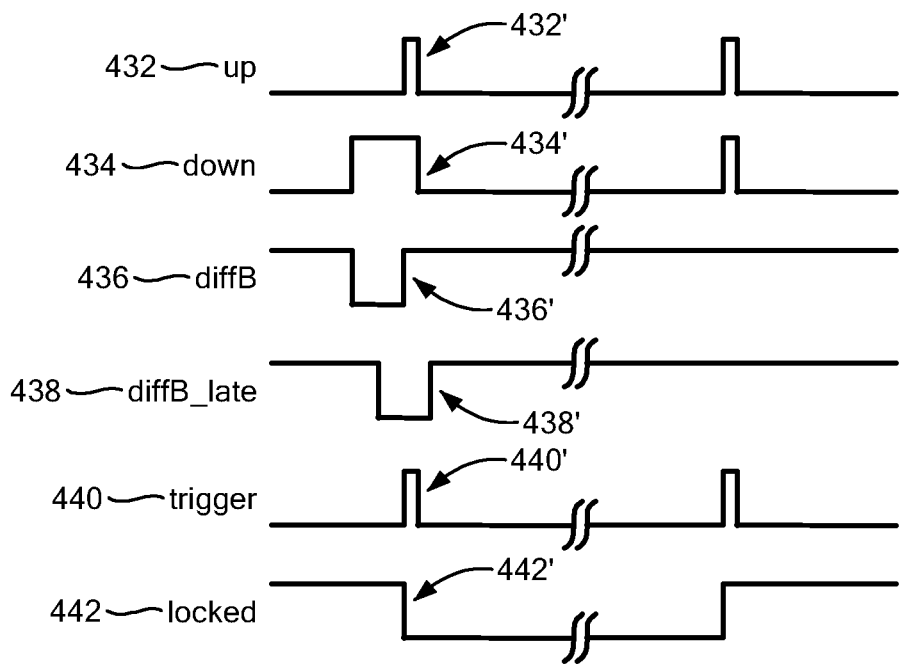

FIG. 4 is a block diagram of an example lock-state detection system/circuit 400, in accordance with the present disclosure. Lock-state detection system/circuit 400 can include a first comparator (e.g., exclusive NOR gate) 402, inputs 404 and 406 for up and down signals, e.g., from a DLL phase detector, a second comparator (e.g., AND gate) 408, a programmable delay line 410 configured to receive a delay control signal 412 (indicated as "Program bits"), and a latch or flip-flop 414 having an output 418, as shown. The AND gate 408 can be configured to receive up and down signals on inputs 404 and 406, e.g., from a phase detector (PD), and produce an output, shown as trigger signal 416. Flip-flop 414 is configured to receive the trigger signal 416 as an input. Flip-flop 414 can include a Q bar output 420, as shown. In some embodiments, flip-flop 414 can optionally include a reset input (not shown). Lock detector system/circuit 400 can be used with, e.g., other embodiments of the present disclosure such as DLL lock-error check circuit 300 of FIG. 3.

As noted above, a DLL (e.g., DLL 200 of FIG. 2 or DLL 301 of FIG. 3) can produce up and down signals (e.g., pulses) which system/circuit 400 can receive at inputs 404, 406. In a locked state, the up and down signals (e.g., pulses 404' and 406') will be equal or substantially equal (e.g., within allowed tolerances) to each other in width (e.g., as shown by relatively short pulses 224' and 226' in FIG. 2). The XNOR gate 402 is configured to produce an output signal 403 (different-state signal, referenced as "diffB") 403 that represents when the up and down signals 404', 406' are different. In example embodiments, when the up and down signals 404', 406' are different, the diffB signal 403 is low, otherwise if the up and down signals 404', 406' are equal, then the diffB signal 403 is high. Accordingly, the diffB signal 403 can be sampled at an appropriate time to determine whether the DLL is in a locked condition or not.

As configured, the up and down pulses (e.g., 404' and 406') coming from the DLL can be provided to logic AND gate 408 to generate the trigger signal 416. Regardless of the locked status of the DLL, the up and down signals 404', 406' will both be high at some point every clock cycle, and consequently the trigger signal 416 will go high once every clock cycle. In order to sample the different-state signal ("diffB") 403 at an appropriate time, diffB 403 can be delayed with programmable delay element 410. Trigger signal 416 can be used to sample the value of the delayed different state signal 413 ("diffB_late" signal). In example embodiments, the delay element 410 can be variable so that the system 400 can be programmed to detect a lock condition within a certain timing window or threshold (D). By using a timing threshold, the lock detect circuit 400 can detect a lock condition even when the up and down pulses 404', 406' are different only for a short time provided that time occurs within the window or threshold (D). The Window or threshold D can be programmable and may be set (programmed) by the variable delay 410, e.g., by the program bits 412.

The programmable delay 410 can be used to reduce the error due to different delays on the up and down signals 404', 406'. For example, if for some reason these two up and down signals 404', 406' are not delivered to the lock detection circuit 400 with an equal delay, the circuit 400 could fail to detect a lock state. By increasing the delay D (threshold or window, within which a locked state is deemed to occur) of the programmable delay element 410 this effect can be mitigated.

Waveforms 432-442 illustrate representative operation of system/circuit 400. As shown, representative up and down pulses 432', 434', are provided to up and down lines 432, 434, respectively. DiffB and diffB_late pulses 436' and 438' are shown on diffB and diffB_late lines 436 and 438, respectively. Trigger pulse 440' is shown on trigger line 440 while locked signal 442' is shown on locked signal line 442 as going low to indicate a non-locked state or condition.

As noted previously, DLLs can be subject to stuck-lock error conditions in which the DLL phase detector (PD) provides a phase error indication opposite of the actual phase error. The stuck-lock problem typically arises from the fact that phase detectors only compare signal transitions as presented on their inputs and are agnostic of specific edge transitions (e.g., high-to-low, or low-to-high). In a lidar application DLL, the phase detector typically (PD) compares a reference clock (e.g., at N+1 edges) to a delayed version of the reference clock (e.g., at N edges) to servo-control the delay line to correct delay setting matching the period (T) of the reference clock. This can be particularly problematic in lidar applications where the delay clock signal is delayed by more than one clock period (T) of the reference clock. At system startup, because the reference clock is compared to the delay clock, it is possible for the DLL phase detector to indicate a phase error opposite of the actual phase error. This in turn can lead the DLL to attempt to drive (servo control) the delay line to a minimum delay setting in an attempt to drive the delay to zero, where it actually should be increasing the delay on the delay line for proper alignment of the delay clock with the reference clock. Such a condition is typically non-recoverable or "stuck" without external intervention. Embodiments of the present disclosure provide systems, circuits, and methods allowing a DLL to mitigate, e.g., prevent or recover from, stuck-lock error conditions.

Figure 5:
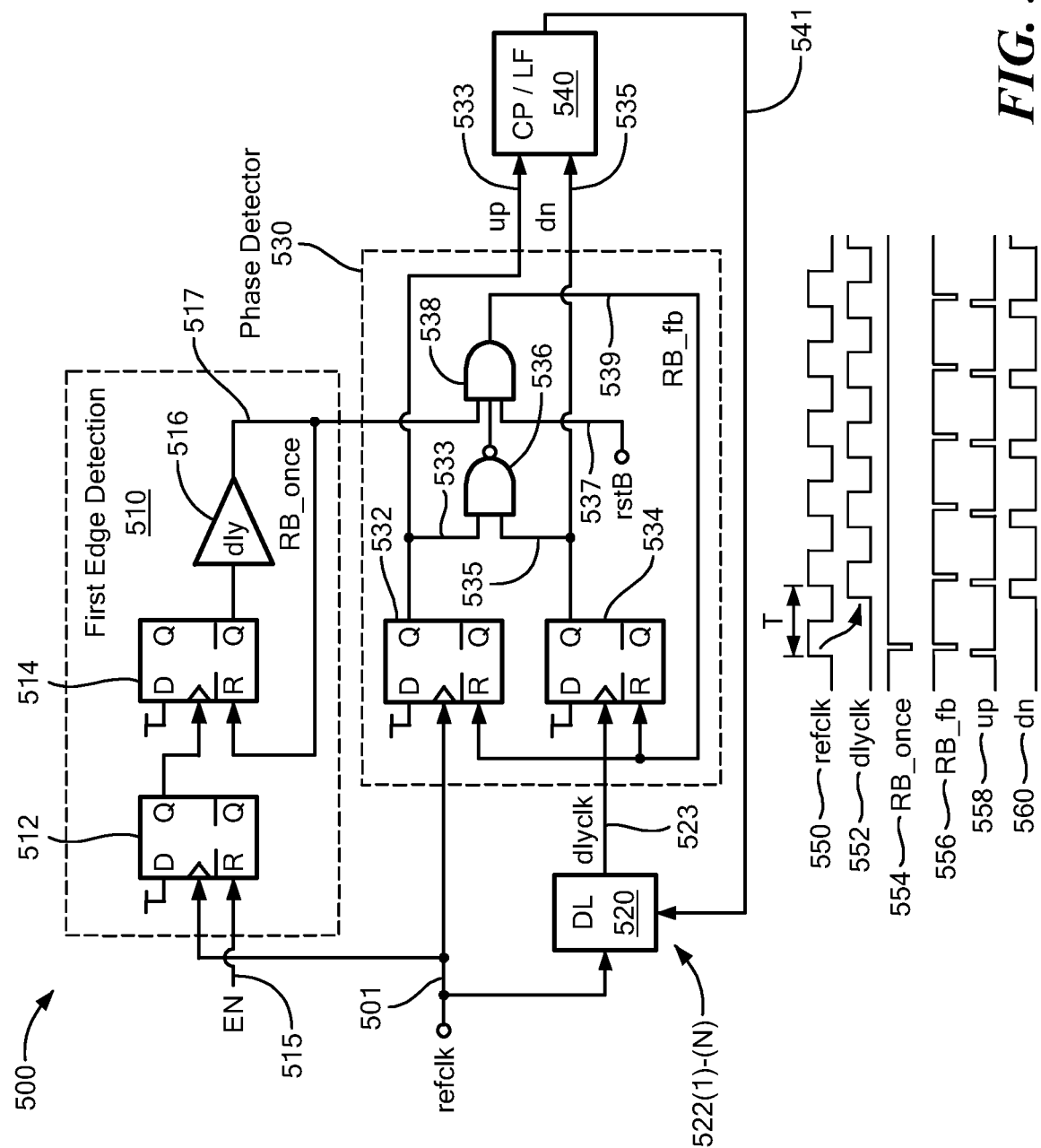
FIG. 5 is a block diagram of an example stuck-lock avoidance system/circuit, in accordance with the present disclosure.

FIG. 5 is a block diagram of an example DLL phase detector stuck-lock avoidance system/circuit 500, in accordance with the present disclosure. As shown, system/circuit 500 can include first-edge detection circuitry 510, a delay line 520, phase detector circuitry 530, and charge pump and loop filter (CP/LF) 540. System/circuit 500 can operate to cause the phase detector circuitry 530 to ignore the first edge of the reference clock signal (pulse) presented to the phase detector circuitry 530 and thereby allow the proper edge alignment between the delayed reference clock and the reference clock signals. In example embodiments, system/circuit 500 can include matched replicas of the delay line 520 to develop timing measurements with resolutions that are a fraction of the provided reference clock period (T).

The delay line (DL) 520 can include a desired number (plurality) of (N) adjustable delay elements connected in series and is configured have a delay set by a delay control 541. In example embodiments, DL 520 can be configured to form fractional clock period timing between the individual delay elements. The DL 520 can be incorporated in a delay-locked-loop (DLL) along with the phase detector circuitry 530, and charge pump and loop filter (CP/LF) 540. The delay control can be tuned by this loop to match the total delay through all of the elements to a reference clock period provided to the DLL, as shown by reference clock input 501. The charge pump and loop filter (CP/LF) 540 can convert the up and down signals (e.g., pulses) into a voltage control signal 541 which can be fed back to delay line 520 and for a delay control input.

The phase detector (PD) circuitry 530 can include two edge-sensitive input circuit elements 532, 534 configured to receive reference clock and delay clock signals, respectively. Phase detector circuitry 530 can also include comparison logic 536 (shown as a NAND gate) and 538 (shown as AND gate with three inputs) to identify when edges of both signals (e.g., pulses) have arrived. The phase detector circuitry 530 provides up and down output signals (shown on 533 and 535, respectively) indicating the relative phase delay direction required to be applied to the delay line (DL) 520 to align the input edges of the delay clock signal 523 with those of the reference clock signal 501.

When one signal (up or down) is present without the other, the DLL adjusts the delay line 520 in the commanded direction. When both are present or absent, the DLL does not adjust the delay line control. When one input edge arrives before the other, its corresponding phase indication output is triggered and when the second input edge arrives both phase indications are momentarily selected until the comparison logic 536, 538 forces the edge-sensitive input circuit elements 532, 534 to reset and await the next edges for phase comparison. An additional input can be provided to the phase comparison logic 538, as shown, allowing the first edge detection circuitry 510 to intervene in the operation of the phase detector 530 by providing momentary output pulse 517 as a reset trigger to cause the system/circuit 500 to ignore or disregard the first edge on the reference clock signal.

The first-edge detection circuitry 510 can include two edge-sensitive circuits (e.g., latches) 512, 514 in series and delay element 516 configured so that the first input edge, after some delay, produces a momentary output pulse (shown as "RB_once") 517 which is provided to the phase detector 530 to cause the phase detector 530 to reset and disregard the first pulse edge of the reference clock. Latch 512 is shown with an enable (EN) input 515, which may be used to reset the latch 512. Latch 514 is shown with a reset input configured to receive and be triggered by the momentary output pulse 517. In example embodiments, once the momentary output pulse 517 has been generated, the first-edge detection circuit 510 no longer provides any function unless an external reset is applied to the edge-sensitive logic elements 512, 514 resetting them and preparing them to respond to another "first input edge."

Example waveforms 550-560 illustrate representative operation of system/circuit 500. Reference clock signal 550 is shown next to a delayed clock signal 552, which is a delayed version of the reference clock signal 550. As shown, delay clock signal 552 has a delay of less than one clock period (T). The phase detector circuitry 530 could, without the presence of first-edge detection circuitry 510, attempt to reduce the delay on the delay clock 552 and thereby shift the delay clock signal 552 to the left (earlier in time), i.e., in the wrong direction for correct timing. The momentary signal (from first edge detection circuitry 510) can be applied at 554 to inform the system/circuit 500 to ignore the initial up command on control line 558. System/circuit 500 continues operation and the phase detector circuitry 530 produces a net down command to slow the reference clock (move the pulses to the right) as indicate by the difference in the widths of the commands on the up and down lines 558 and 560, respectively. The phase detector reset commands are shown on 556.

System/circuit 500, with first-edge detection circuitry 510, can accordingly ensure that at start up, the circuit 500 will start applying delay (increasing in the direction to 1T) to the delay line signal instead of initially reducing delay (attempting to drive the delay to 0). System/circuit 500 can accordingly address and prevent stuck-lock errors such as in situations where, at system start, the delay clock is faster than the reference clock.

Figure 6:
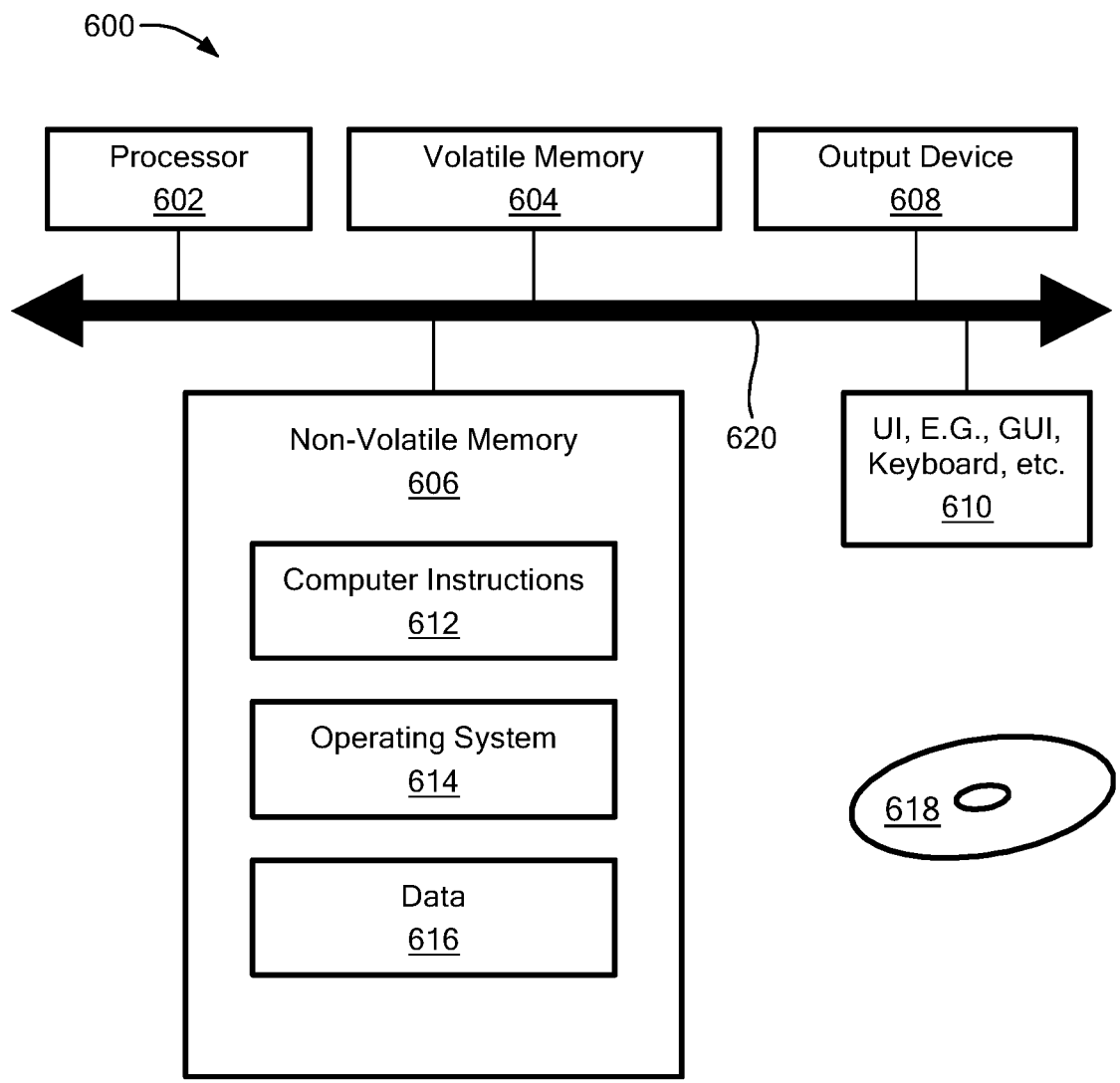
FIG. 6 is a block diagram of an example computer system operative to perform processing, in accordance with the present disclosure.

FIG. 6 is a block diagram of an example computer system 600 operative to perform processing, in accordance with the present disclosure. Computer system 600 can perform all or at least a portion of the processing, e.g., steps in the algorithms and methods, described herein. The computer system 600 includes a processor 602, a volatile memory 604, a non-volatile memory 606 (e.g., hard disk), an output device 608 and a user input or interface (UI) 610, e.g., graphical user interface (GUI), a mouse, a keyboard, a display, and/or any common user interface, etc. The non-volatile memory (non-transitory storage medium) 606 stores computer instructions 612 (a.k.a., machine-readable instructions, computer-readable instructions, or code) such as software (computer program product, or one or more software applications), an operating system 614 and data 616. In one example, the computer instructions 612 are executed by the processor 602 out of (from) volatile memory 604. In one embodiment, an article 618 (e.g., a storage device or medium such as a hard disk, an optical disc, magnetic storage tape, optical storage tape, flash drive, etc.) includes or stores the non-transitory computer-readable instructions. Bus 620 is also shown.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., port or bus) to perform processing and to generate output information.

The system 600 can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as, special purpose logic circuitry, e.g., an FPGA (field programmable gate array) and/or an ASIC (application-specific integrated circuit).

Accordingly, embodiments of the inventive subject matter can afford various benefits relative to prior art techniques. Embodiments of the present disclosure can provide for Example embodiments of the present disclosure can enable or provide lidar systems and components achieving or obtaining an Application Safety Integration Level (ASIL) in accordance with a safety standard such as ISO 26262.

Various embodiments of the concepts, systems, devices, structures, and techniques sought to be protected are described above with reference to the related drawings. Alternative embodiments can be devised without departing from the scope of the concepts, systems, devices, structures, and techniques described. For example, while description of embodiments of the present disclosure has been in the context of sensors used with or for lidar systems, aspects of the present disclosure can include or be applied to other types of sensor systems, e.g., acoustic, seismic, pressure, acceleration, to name just a few. While reference has been made to certain systems/circuits shown in the figures, alternative embodiments may be practiced within the scope of the present disclosure. For example, while DLL false-lock detection system/circuit 300 of FIG. 3 has been described as potentially including a delay-locked loop (DLL) circuit 301 and a DLL locked-state detection circuit 302, either of both of those components/elements may be omitted from other embodiments of a false-lock detection system/circuit.

It is noted that various connections and positional relationships (e.g., over, below, adjacent, etc.) may be used to describe elements in the description and drawing. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A delay-locked-loop (DLL) false-lock detection system comprising:
   (a) DLL circuitry configured to receive a reference clock signal, wherein the reference clock signal includes a clock cycle having a period (T), and produce a delay clock signal as a delayed replica of the reference clock signal on a delay line controlled by a delay line control signal to match the clock cycle of the reference clock signal, the DLL circuitry including a phase detector configured to measure a phase difference between the reference clock signal and the delay clock signal, wherein the phase detector is configured to produce up and down pulses for controlling a delay of the delay clock signal on the delay line relative to the reference clock signal;
   (b) a test pulse generator configured to produce an output pulse, wherein the output pulse has a pulse width of a single clock period of the reference clock signal;
   (c) a reference delay line configured to receive the output pulse from the test pulse generator and the delay line control signal from the DLL circuitry, wherein the reference delay line is configured to produce an output pulse having the same delay as the delay line of the DLL circuitry relative to the reference clock signal;
   (d) shift register circuitry including a plurality of (N) serially connected stages, the shift register circuitry configured to receive the output pulse from the test pulse generator and the reference clock signal from the DLL circuitry, each stage respectively producing an output pulse aligned with a different multiple of the clock period of the reference clock signal; and
   (e) a plurality of latched comparison circuits corresponding in number (N) to the stages of the shift register circuitry, wherein each latched comparison circuit is configured to receive the output pulse of the reference delay line and an output pulse from a respective stage of the shift register circuitry and to perform a comparison to evaluate whether the received pulses are matched and produce a respective matched-pulse indication when the pulses are matched, wherein the respective matched-pulse indication indicates a locked condition to a respective multiple (1)–(N) of the reference clock signal period (T).

2. The system of claim 1, further comprising lock-state detection circuitry configured to compare the up and down pulses and determine when the DLL circuitry is in a locked condition, wherein the locked state detection circuitry is configured to produce a locked status signal indicating that the DLL circuitry is in a locked condition when the up and down pulses are substantially identical.

3. The system of claim 1, wherein the DLL circuitry comprises a charge pump and loop filter circuitry configured to convert the up and down pulses into the delay line control signal for controlling the delay clock signal.

4. The system of claim 1, wherein each stage of the shift register circuitry comprises a flip flop circuit.

5. The system of claim 4, wherein each flip flop circuit comprises an edge-triggered flip flop circuit.

6. The system of claim 5, wherein the edge-triggered flip flop is configured as a rising-edge flip flop circuit.

7. The system of claim 1, wherein each of the plurality of latched comparison circuits comprises a pair of serially connected flip flop circuits.

8. The system of claim 1, wherein the test pulse generator is configured to generate the output pulse in response to a lock check input signal.

9. The system of claim 1, wherein the reference delay line comprises a matched copy of the delay line of the DLL circuitry.

10. The system of claim 1, wherein the delay through the reference delay line comprises a multiple of the reference clock period.

11. The system of claim 1, wherein the delay through the reference delay line equals the reference clock period.

12. The system of claim 1, wherein a respective multiple of 1T indicates a correct lock condition.

13. The system of claim 1, wherein a respective multiple of greater than or equal to 2T indicates a false-lock condition.

14. The system of claim 1, wherein the delay line comprises a plurality of adjustable delay elements connected in series and configured to form fractional clock period timing between the individual adjustable delay elements.

15. The system of claim 1, wherein the lock-state detection circuitry comprises:
   a first comparator configured to receive the up and down pulses from the phase detector and produce as an output a different-state signal indicative of when the up and down signals pulses are different;
   a second comparator configured to receive the up and down pulses from the phase detector and produce an output trigger signal indicative of when the up and down pulses are substantially equal;
   a delay line configured to receive the different-state signal from the first comparator and to produce delayed version of the different-state signal as an output; and
   a latch configured to produce an output signal in response to the trigger signal from the second comparator.

16. The system of claim 15, wherein the first comparator comprises an exclusive NOR gate.

17. The system of claim 15, wherein the second comparator comprises an AND gate.

18. The system of claim 15, wherein the delay line of the lock-state detection circuitry is programmable to delay the different-state signal by a desired delay (D).

19. A delay-lock-loop (DLL) phase detector stuck-lock avoidance system comprising:
   a. DLL circuitry configured to receive a reference clock signal, wherein the reference clock signal includes a clock cycle having a period, and including a delay line, wherein the DLL circuitry is configured to produce a delay clock signal on the delay line controlled by a delay line control signal to match the clock cycle of the reference clock signal;
   b. first-edge detection circuitry configured to receive the reference clock signal and produce an output pulse in response to a first edge of the reference clock signal, wherein the output pulse is produced after a predetermined delay; and
   c. phase detector circuitry configured to receive the reference clock signal and the delay clock signal, and to compare when a first edge of each of the respective signals is received, wherein the phase detector circuitry is further configured to produce up and down pulses for controlling a delay of the delay clock signal on the delay line relative to the reference clock signal, and wherein the phase detector circuitry is configured to receive the output pulse from the first-edge detection circuitry and, in response, to disregard a first pulse of the reference clock signal.

20. The system of claim 19, wherein the phase detector circuitry includes first and second edge-sensitive input circuit elements configured to receive the reference clock signal and the delay clock signal, respectively, and to produce the up and down pulses, respectively, in response to detecting a signal-state transition edge.

21. The system of claim 20, wherein the first and second edge-sensitive input circuit elements comprises first and second latches configured in parallel.

22. The system of claim 21, wherein the first and second latches comprise rising-edge sensitive latches.

23. The system of claim 19, wherein the phase detector circuitry includes comparison logic configured to identify when each of the edges has been received.

24. The system of claim 23, wherein the comparison logic comprises a NAND gate.

25. The system of claim 19, wherein the DLL circuitry comprises a charge pump and loop filter circuitry configured to convert the up and down pulses into the delay line control signal for controlling the delay clock signal.

26. The system of claim 19, wherein the first-edge detection circuitry comprises first and second edge-sensitive latches in series.

27. The system of claim 26, wherein the first-edge detection circuitry further comprises a delay element configured to receive an output of the second edge-sensitive latch and produce the output pulse after the predetermined delay.

28. The system of claim 20, wherein the phase detector circuitry further comprises reset logic configured to provide a reset signal to the first and second edge-sensitive input circuit elements for resetting the phase detector.

29. The system of claim 19, wherein the delay line comprises a plurality of adjustable delay elements connected in series and configured to form fractional clock period timing between the individual adjustable delay elements.

* * * * *

UNITED STATES PATENT AND TRADEMARK OFFICE
CERTIFICATE OF CORRECTION

| | |
|---|---|
| PATENT NO. | : 11,722,141 B1 |
| APPLICATION NO. | : 17/660221 |
| DATED | : August 8, 2023 |
| INVENTOR(S) | : Leo Filippini et al. |

It is certified that error appears in the above-identified patent and that said Letters Patent is hereby corrected as shown below:

In the Specification

Column 7, Line 67, delete "$1/R'4$ for small objects and $1/R'2$" and replace with --$1/R^4$ for small objects and $1/R^2$ --.

Column 8, Line 11, delete "$10'12$" and replace with --$10^{12}$--.

Column 8, Line 14, delete "$(10'12)$" and replace with --$(10^{12})$--.

Column 9, Line 53, delete "$10'12$" and replace with --$10^{12}$--.

Signed and Sealed this
Eighteenth Day of February, 2025

Coke Morgan Stewart
*Acting Director of the United States Patent and Trademark Office*